(12) United States Patent
Martens et al.

(10) Patent No.: US 11,735,645 B2
(45) Date of Patent: Aug. 22, 2023

(54) METHOD FOR FORMING A BIOFET SENSOR INCLUDING SEMICONDUCTOR FIN OR NANOWIRE

(71) Applicants: IMEC VZW, Leuven (BE); Katholieke Universiteit Leuven, KU LEUVEN R & D, Leuven (BE)

(72) Inventors: Koen Martens, Aalter (BE); Sybren Santermans, Lummen (BE); Geert Hellings, Halle (BE); David Barge, Schaarbeek (BE)

(73) Assignees: Imec VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 114 days.

(21) Appl. No.: 17/099,339

(22) Filed: Nov. 16, 2020

(65) Prior Publication Data
US 2021/0159321 A1    May 27, 2021

(30) Foreign Application Priority Data
Nov. 21, 2019  (EP) .................................... 19210494

(51) Int. Cl.
*H01L 29/66* (2006.01)
*G01N 27/414* (2006.01)

(52) U.S. Cl.
CPC ..... *H01L 29/6656* (2013.01); *G01N 27/4145* (2013.01)

(58) Field of Classification Search
CPC ........... H01L 29/6656; H01L 29/66787; H01L 29/66795; G01N 27/4145

USPC .......................................................... 438/49
See application file for complete search history.

(56) References Cited

U.S. PATENT DOCUMENTS

| | | | |
|---|---|---|---|
| 7,151,301 B2 | 12/2006 | Yoo et al. | |
| 7,906,802 B2 | 3/2011 | Baumgartner et al. | |
| 8,022,444 B2 | 9/2011 | Kim et al. | |
| 8,896,032 B2 | 11/2014 | Cheng et al. | |
| 8,994,077 B2 * | 3/2015 | Afzali-Ardakani | G01N 27/4145 257/253 |

(Continued)

OTHER PUBLICATIONS

Ahn, J-H., et al., "CMOS-Based Biosensors with an Independent Double-Gate FinFET", 2011 International Electron Devices Meeting, Washington, DC, 2011, pp. 36.2.1 to 36.2.4.

(Continued)

*Primary Examiner* — Matthew E. Gordon
(74) *Attorney, Agent, or Firm* — McDonnell Boehnen Hulbert & Berghoff LLP

(57) ABSTRACT

A method for forming a sensor is provided. The method includes: providing an active region comprising a channel having: a length, and a periphery consisting of one or more surfaces having said length, said periphery comprising a first part and a second part, each part having said length, the first part representing from 10 to 75% of the area of the periphery and the second part representing from 25 to 90% of the area of the periphery; providing a first dielectric structure on the entire first part, the first dielectric structure having a maximal equivalent oxide thickness; and providing a second dielectric structure on the entire second part, the second dielectric structure having a minimal equivalent oxide thickness larger than the maximal equivalent oxide thickness of the first dielectric structure.

20 Claims, 11 Drawing Sheets

(56) References Cited

U.S. PATENT DOCUMENTS

| | | | |
|---|---|---|---|
| 9,029,132 B2* | 5/2015 | Khater | G01N 27/4145 436/524 |
| 9,570,288 B2* | 2/2017 | Rigante | H01L 29/6653 |
| 9,733,210 B2 | 8/2017 | Cheng et al. | |
| 9,810,660 B2* | 11/2017 | Hu | G01N 27/4145 |
| 9,841,398 B2 | 12/2017 | Bustillo et al. | |
| 2013/0089932 A1 | 4/2013 | Wu et al. | |
| 2013/0214332 A1 | 8/2013 | Wu | |
| 2014/0106494 A1* | 4/2014 | Bedell | H01L 21/84 257/E21.409 |
| 2016/0320336 A1 | 11/2016 | Collaert et al. | |
| 2018/0106796 A1 | 4/2018 | Sheu et al. | |
| 2018/0328882 A1 | 11/2018 | Shalev et al. | |

OTHER PUBLICATIONS

Rigante, S., et al., "FinFET Integrated Low-Power Circuits for Enhanced Sensing Applications", Sensors and Actuators B, 2013, vol. 186, pp. 789-795.

Zhang, Q., et al., "Si Nanowire Biosensors Using a FinFET Fabrication Process for Real Time Monitoring Cellular Ion Actitivies", 2018 IEEE International Electron Devices Meeting (IEDM), San Francisco, CA, 2018, pp. 29.6.1 to 29.6.4.

Chen, D., et al., "Selective N-terminal functionalization of native peptides and proteins", Chem. Sci., 2017, 8, pp. 2717 to 2722.

Olsen, T., et al., Electronic Measurements of Single-Molecule Processing by DNA Polymerase I (Klenow Fragment), Journal of The American Chemical Society, 2013, vol. 135, pp. 7855 to 7860.

Choi, Y., et al., "Single-Molecule Lysozyme Dynamics Monitored by an Electronic Circuit", Science, vol. 335, Jan. 20, 2012, pp. 319 to 324.

Sims, P., et al., "Electronic Measurements of Single-Molecule Catalysis by cAMP-Dependent Protein Kinase A", Journal of The American Chemical Society, 2013, vol. 135, pp. 7861 to 7868.

Boutureira, O., et al., "Advances in Chemical Protein Modification", Chem. Rev., 2015, vol. 115, pp. 2174-2195.

Chan, A.O., et al., "Modification of N-Terminal α-Amino Groups of Peptides and Proteins Using Ketenes", J. Am. Chem. Soc., 2012, vol. 134, pp. 2589-2598.

Elsohly, A.M., et al., "Development of Oxidative Coupling Strategies for Site-Selective Protein Modification", Acc. Chem. Res., 2015, vol. 48, pp. 1971-1978.

Gilmore, J.M., et al., "N-Terminal Protein Modification through a Biomimetic Transamination Reaction", Angew. Chem. Int. Ed., 2006, vol. 45, pp. 5307-5311.

Humenik, M., et al., "C-Terminal Incorporation of Bio-Orthogonal Azide Groups into a Protein and Preparation of Protein-Oligodeoxynucleotide Conjugates by Cu1-Catalyzed Cycloaddition", ChemBioChem, 2007, vol. 8, pp. 1103-1106.

Rosen, C.B., et al., "Targeting the N Terminus for Site-Selective Protein Modification", Nature Chemical Biology, Jul. 2017, vol. 13, pp. 697-705.

Sasaki, T., et al., "N-Terminal Labeling of Proteins by the Pictet-Spengler Reaction", Bioorg. Med. Chem. Lett., 2008, vol. 18, pp. 4550-4553.

Song, I.T., et al., "PEGylation and HAylation via Catechol: α-Amine-Specific Reaction at N-terminus of Peptides and Proteins", Acta Biomaterialia, 2016, vol. 43, pp. 50-60.

Temming, R.P., et al., "N-terminal Dual Protein Functionalization by Strain-Promoted Alkyne-Nitrone Cycloaddition", Org. Biomol. Chem., 2013, vol. 11, pp. 2772-2779.

* cited by examiner

METHOD FOR FORMING A BIOFET SENSOR INCLUDING SEMICONDUCTOR FIN OR NANOWIRE

CROSS-REFERENCE

This application claims priority to European patent application no. 19210494.1, filed on Nov. 21, 2019, which is incorporated by reference in its entirety.

TECHNICAL FIELD OF THE DISCLOSURE

The present disclosure relates to the field of Field-Effect Transistor-based biosensors and to their fabrication.

BACKGROUND OF THE DISCLOSURE

Biosensors based on the detection of a single molecule, e.g by an enzyme, have been described. These devices are important as they can potentially be adapted to allow massive parallel bio-sensing. Applications, where such devices are of interest, are for instance protein analysis, proteomics (massively parallel protein identification or fingerprinting), immunoassays (antibody or antigen monitoring), and DNA sequencing, amongst others.

Biosensors based on the detection of a single molecule by an enzyme are currently making use of fluorescence and optical detection. This technology imposes limits on the potential sensor density and hence data throughput due to the wave properties of light and the maximum possible pixel density of optical sensors. Electrical single-molecule sensing of enzyme or protein activity making use of field-effect devices (ISFETs, Ion Sensitive Field Effect Transistors) has currently only been reported in a handful of papers which make use of carbon nanotube FETs [Choi et al., *Science*, 2012, Vol. 335, pp. 319-324; Sims et al., *J. Amer. Chem. Soc.*, 2013, Vol. 135, pp. 7861-7868; and Olsen et al., *J. Amer. Chem. Soc.*, 2013, Vol. 135, pp. 7855-7860]. Due to their very small diameter, carbon nanotubes allow the manufacture of highly sensitive sensors. Unfortunately, carbon nanotube FETs are currently not deemed a mass-manufacturable technology.

Biosensors based on more traditional semiconductors, such as silicon, would have the advantage of being mass-manufacturable, but they typically suffer from a low sensitivity.

There is, therefore, a need in the art for new biosensors having a good sensitivity.

SUMMARY OF THE DISCLOSURE

It is an object of the present disclosure to provide methods for forming good (FET-based) sensors.

In embodiments of the present disclosure, the sensors can have good sensitivity. This can be obtained by reducing the screening effect operated by the electrolyte on the target molecule.

In embodiments of the present disclosure, the sensors can be mass-produced.

In embodiments of the present disclosure, the sensors can be produced at a low cost.

In embodiments of the present disclosure, a high integration density can be achieved.

In a first aspect, the present disclosure relates to a method for forming a sensor, the method comprising:
a. Providing an active region comprising a source region, a drain region, and a semiconductor channel region between the source region and the drain region, the semiconductor channel region having:
(i) a length, and
(ii) a periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery,
b. Providing a first dielectric structure on the entire first part, the first dielectric structure having a maximal equivalent oxide thickness, measured perpendicularly to the first part, thereby forming a gate dielectric suitable for being exposed to a fluid to be sensed,
c. Providing a second dielectric structure on the entire second part, the second dielectric structure having a minimal equivalent oxide thickness, measured perpendicularly to the second part, larger than the maximal equivalent oxide thickness of the first dielectric structure, thereby forming an isolation structure.

In a second aspect, the present disclosure relates to a sensor comprising:
a. an active region comprising a source region, a drain region, and a semiconductor channel region between the source region and the drain region, the semiconductor channel region having:
(i) a length, and
(ii) a periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery,
b. a first dielectric structure on the entire first part, the first dielectric structure having a maximal equivalent oxide thickness, measured perpendicularly to the first part, thereby forming a gate dielectric suitable for being exposed to a fluid to be sensed,
c. a second dielectric structure on the entire second part, the second dielectric structure having a minimal equivalent oxide thickness, measured perpendicularly to the second part, larger than the maximal equivalent oxide thickness of the first dielectric structure, thereby forming an isolation structure.

In a third aspect, the present disclosure relates to a biosensing device comprising a sensor according to any embodiments of the second aspect.

Biosensors comprising a FET (bioFET), and especially silicon-based such biosensors, can suffer from a low sensitivity due to electrolyte screening. Indeed, the presence of an electrolyte between the target molecule and the channel of the FET can severely weaken the electric field generated by the target molecule. This problem could be solved by detecting the target molecule in a solution of low salinity, however, for convenience, one would like to operate the bioFET at the relatively high physiological salinity level of typical biological samples. Working at the salinity level of typical biological samples also has the advantage of reducing non-specific binding to the bioFET surface.

The above objective can be accomplished by a sensor and a biosensing device having an electrolyte screening layer reducing the electrolyte thickness present between the channel of the FET and the target molecule.

The above objective can be accomplished by a method and device according to the present disclosure.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 1 illustrates a vertical cross-section taken through the semiconductor channel (1) and perpendicularly to its length. It shows a substrate (4c) made of a dielectric material. The general locations of the source region, drain region, and active region as well as the length of the semi-conductor channel are shown.

FIG. 2 illustrates a vertical cross-section taken through the semiconductor channel (1) and perpendicularly to its length for an embodiment similar to FIG. 1.

FIG. 3 illustrates a representative embodiment of a sensor that can be obtained by a method of the disclosure.

FIG. 4 illustrates another representative embodiment of a sensor that can be obtained by a method of the disclosure.

FIG. 5 illustrates yet another representative embodiment of a sensor that can be obtained by a method of the disclosure.

FIG. 6 illustrates a further representative embodiment of a sensor that can be obtained by a method of the disclosure.

FIG. 7 is similar to FIG. 1 but illustrates that the substrate (8) is made of the same material as the semiconductor channel (1).

FIG. 8 is similar to FIG. 2 but illustrates that the substrate (8) is made of the same material as the semiconductor channel region (1).

FIG. 9 illustrates a vertical cross-section, taken perpendicularly to the length of a semiconductor channel (1).

FIG. 10 illustrates another representative embodiment of a sensor that can be obtained by a method of the disclosure.

FIG. 11 illustrates an embodiment similar to FIG. 12 but where the first part (2a) of the periphery (2) consists of the sidewall surfaces (2s) and the second part (2b) of the periphery (2) consists of the top (2u) and bottom (2u) surfaces.

FIG. 12 illustrates a vertical cross-section, taken perpendicularly to the length of a nanowire, of a representative sensor.

Figure 1:
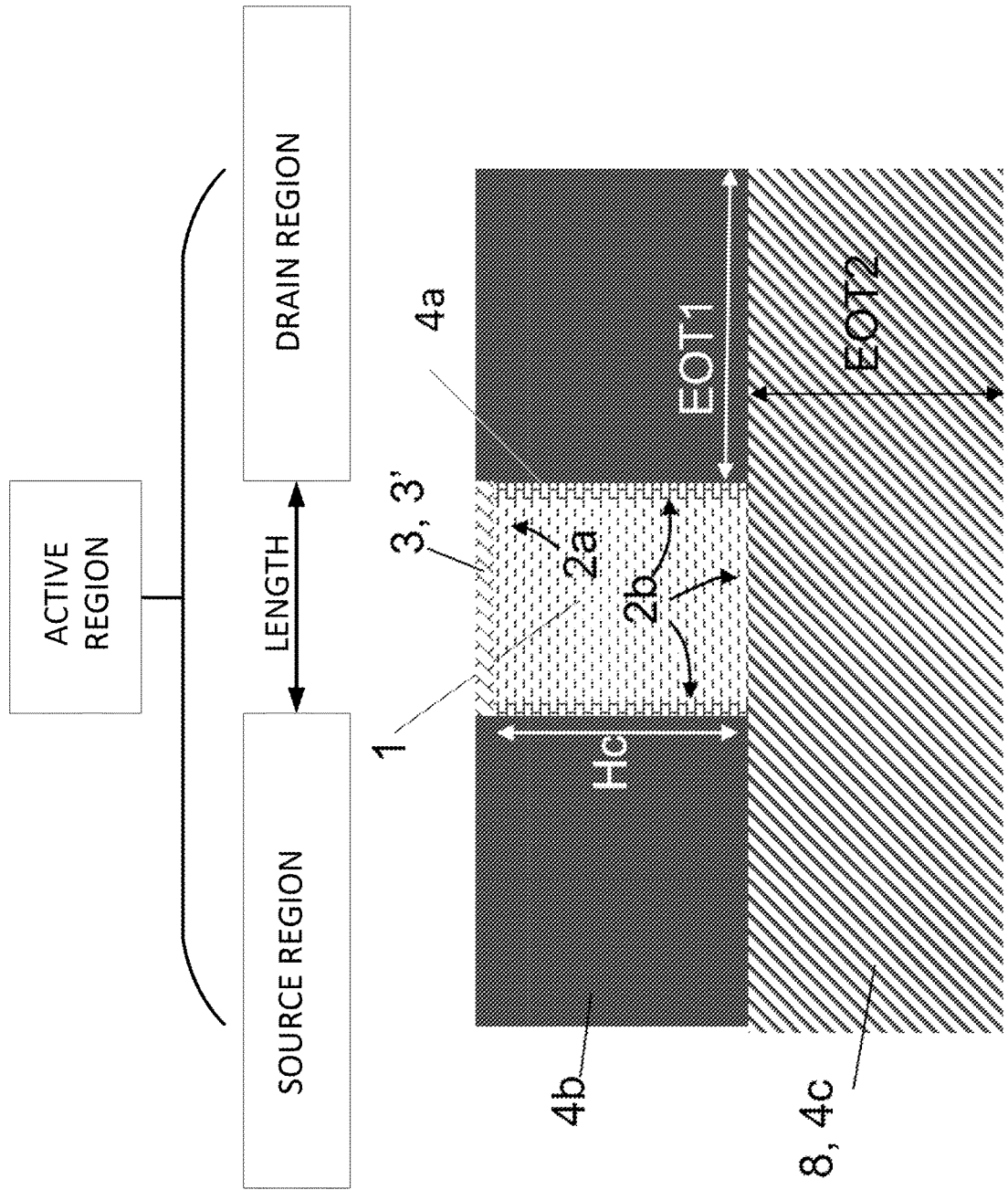
FIGS. 1 to 12 are schematic illustrations of vertical cross-sections of sensors obtained in embodiments of the present disclosure.

In the different figures, the same reference signs refer to the same or analogous elements.

DETAILED DESCRIPTION OF THE DISCLOSURE

The present disclosure can be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It will be understood that the terms so used are interchangeable under appropriate circumstances and that the embodiments of the disclosure described herein are capable of operation in other sequences than described or illustrated herein.

It will be noticed that the term "comprising", used in the claims, should not be interpreted as being restricted to the means listed thereafter; it does not exclude other elements or steps. It will be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Similarly, it will be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed disclosure requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

The first aspect of the present disclosure relates to a method for forming a sensor.

The sensor may be for sensing a target molecule. Typically, the sensor senses a single target molecule at a time. The target molecule can be a biomolecule such as a substrate of an enzyme or a polynucleotide. The target molecule is typically charged. The presence of this charge close to the channel is typically felt by the sensor. The target molecule is in a liquid medium, typically an electrolyte. Most typically, the liquid medium may be an aqueous electrolyte medium such as a biological fluid. The sensor of the present disclosure may be particularly well suited to detect the target molecule in a biological fluid. The detection of a target molecule in a biological fluid with a conventional BioFET was problematic due to the high salinity, and therefore the high screening effect of typical biological samples, a problem that the present disclosure addresses.

The sensor of the present disclosure is typically referred to as a BioFET. BioFETs sense molecules as charges or dielectric displacements close to their gate dielectric. These transistors do not have a solid gate electrode directly in contact with the gate dielectric. Instead, they have a liquid electrolyte gate in contact with the gate dielectric and a solid reference electrode in electrical contact with the liquid electrolyte gate. The sensed molecules are located in this liquid gate near the gate dielectric surface. The molecular charge or dielectric displacement near the gate dielectric causes a change in the current running through the semiconductor channel of the device as dictated by the disturbance in the electrical potential landscape these molecules cause.

Referring now to FIGS. 1 to 12, the method comprises a step a of providing an active region comprising a source region, a drain region, and a semiconductor channel region (1) between the source region and the drain region, the semiconductor channel region having:
  (i) a length, and
  (ii) a periphery (2) consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery.

The active region typically comprises a semiconductor material such as, but not limited to, silicon.

In embodiments, the active region may be comprised in a fin or a nanowire. In embodiments, the active region may be a fin or a nanowire.

The source region and the drain region are typically doped regions of the active region. The semiconductor channel region can be a region of the active region that is not doped (i.e. it has an intrinsic doping level) or is less doped than the source region and the drain region.

The length of the channel region equals the distance between the source region and the drain region.

In the typical case of a channel having a rectangular cuboid shape, the periphery consists of the four longest rectangular plane surfaces. In the special case of a channel having a cylindrical shape, the periphery consists of a single curved surface.

In embodiments, step a of providing an active region may comprise the steps of:

a1. Forming a semiconductor fin, a2. Implanting dopants in spatially separated regions of the semiconductor fin, thereby forming the source and the drain regions, and a3. Annealing the implanted regions.

In embodiments, step a1 of forming a semiconductor fin may comprise the steps of a11 providing a semiconductor layer and a12 patterning this semiconductor layer. The step a11 of providing the semiconductor layer may, for instance, consist of providing a semiconductor on insulator (e.g. silicon-on-insulator, SOI) substrate or a semiconductor (e.g. Si) wafer.

In FIGS. 1, 3, and 7 to 10, the first part of the periphery is the surface forming the top surface of the periphery.

Figure 5:
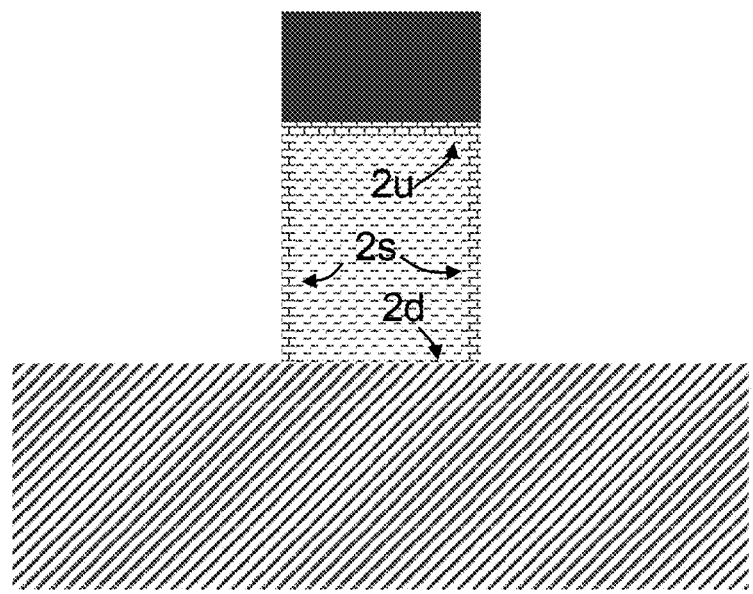
Figure 6:
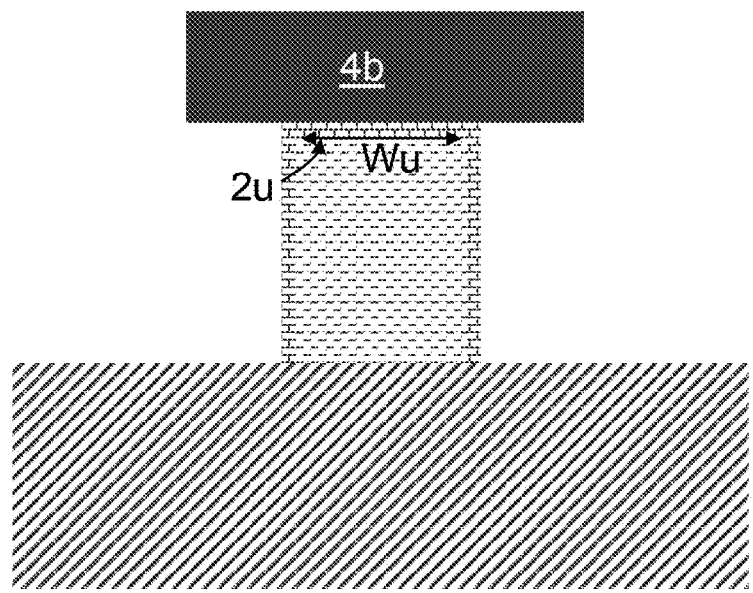
Figure 11:
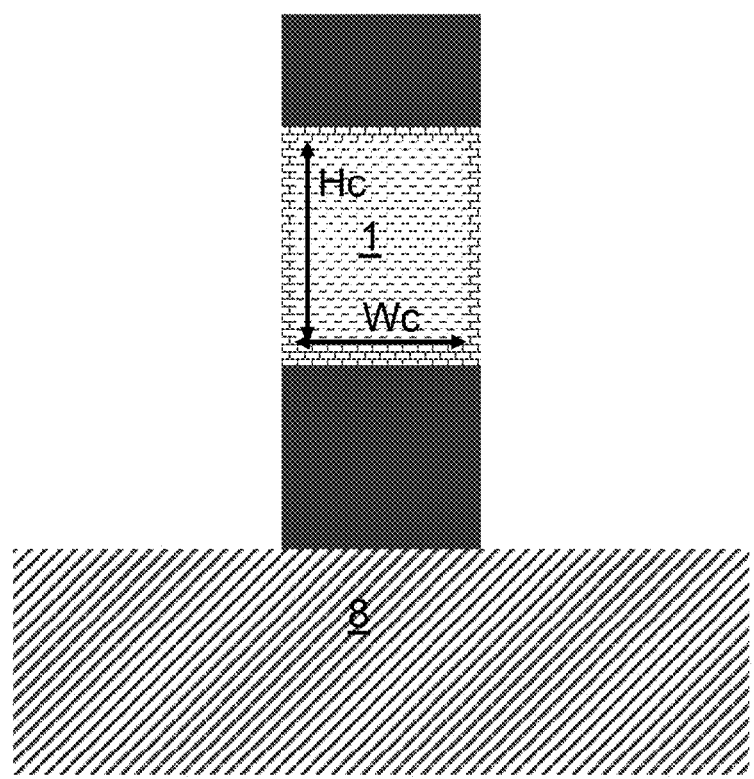

In FIGS. 5, 6, and 11, the first part of the periphery is the surfaces forming the sidewalls of the periphery.

Figure 12:
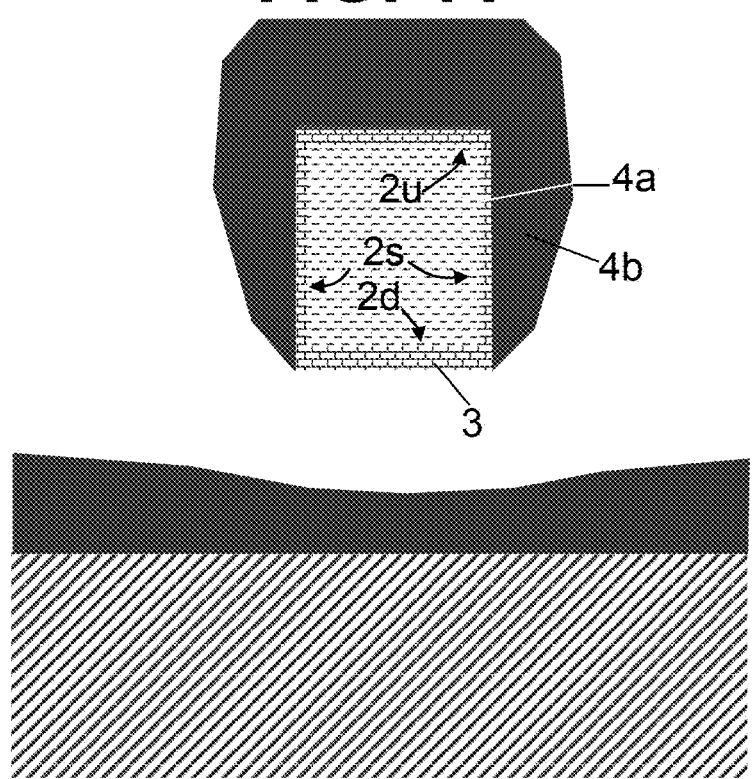

In FIG. 12, the first part of the periphery is the surface forming the bottom of the periphery.

The method comprises a step b of providing a first dielectric structure (3) on the entire first part of the periphery, the first dielectric structure having a maximal equivalent oxide thickness, measured perpendicularly to the first part, thereby forming a gate dielectric suitable for being exposed to a fluid to be sensed.

The first dielectric structure can be made of any dielectric material. For instance, it can be made of silicon dioxide or hafnium dioxide. In embodiments, the maximal equivalent oxide thickness of the first dielectric structure ranges from 0.5 to 4 nm.

As used herein, the term "equivalent oxide thickness" or "EOT" refers to the thickness in nanometers (nm) of a silicon oxide film that would be needed to produce the same effect as the dielectric material actually being used.

As used herein, the term "maximal equivalent oxide thickness" or "MaxEOT" relates to the largest dielectric structure EOT existing on the first part of the periphery. For instance, in the typical case where the first dielectric structure is a single layer of uniform thickness and material composition, it typically has a uniform EOT for the entire first part and the maximal equivalent oxide thickness typically is simply that EOT. This embodiment is, for instance, illustrated in FIG. 13. However, if the first dielectric structure is not uniform on the entire first part, e.g. if it has a first EOT (EOT1) on a first sub-part of the first part of the periphery and has a second EOT (EOT2) on a second sub-part of the first part of the periphery, the maximal equivalent oxide thickness is typically the largest of EOT1 and EOT2.

The EOT is measured perpendicularly to the first part.

In embodiments, the maximal equivalent oxide thickness of the first dielectric structure may be from 0.5 to 4 nm.

The first part of the periphery represents from 10 to 75% of the surface of the periphery.

In embodiments, the first part of the periphery represents from 10 to 45% of the surface of the periphery.

Typically, in the case of a periphery consisting of three or more surfaces (e.g. four surfaces), the first part of the periphery consists of one or two surfaces having said length.

In FIGS. 1, 3, 7 to 10, and 12, the first part of the periphery consists of one surface having said length.

In FIGS. 5, 6, and 11, the first part of the periphery consists of two surfaces having said length.

In embodiments, step b may comprise thermally oxidizing the first part of the periphery, thereby forming the first dielectric structure. This thermal oxidation step may result in the formation of a thermal oxide layer on both the first part and at least a sub-part of the second part of the periphery.

The at least a sub-part of the second part of the periphery can then later be covered with an additional dielectric structure. This is the case for all embodiments illustrated in the figures. The combination of the thermal oxide layer on the at least a sub-part of the second part of the periphery and of the additional dielectric structure can together form part or all of the second dielectric structure. Representaive embodiments where this combination forms only part of the second dielectric structure are illustrated in FIGS. 1, 3, 5, and 6. Representative embodiments where this combination forms all of the second dielectric structure are illustrated in FIGS. 7 to 12.

The first dielectric structure serves as a gate dielectric. In the sensor in operation, this gate dielectric is typically exposed to a fluid to be sensed. The fluid to be sensed is typically a liquid medium as defined herein, i.e. a liquid medium comprising a target molecule.

The method comprises a step c of providing a second dielectric structure on the entire second part. The second part represents from 25 to 90% of the area of the periphery. The second part is different from the first part. The second dielectric structure has a minimal equivalent oxide thickness, measured perpendicularly to the second part, larger than the maximal equivalent oxide thickness of the first dielectric structure. The second dielectric structure forms an isolation structure.

The second dielectric structure can be made of any dielectric material or combination of dielectric materials. Generally, materials for entering the composition of the second dielectric structure are materials having a k-value of at most 10, at most 8, and at most 4. Examples of such materials are $SiO_2$ (k-value of about 3.9), SiN (k-value of 7-8), SiOC (k-value below 3), and low-k dielectrics (k-value<3.9) in general. The second dielectric structure can be made of a single material or of a plurality of materials. The second dielectric structure may be made of the same material as the first dielectric structure or it may comprise a different material. The second dielectric structure may have a different nature (e.g. a different chemical composition and/or a different thickness) on different sub-parts of the second part. For instance, if it covers a plurality of surfaces, it may have a first nature on a first surface and a different nature on a second surface.*

Figure 13:
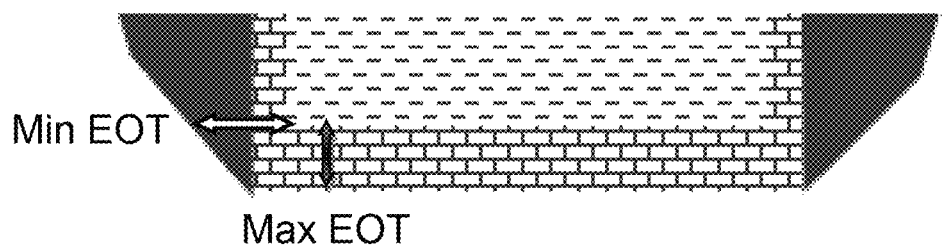
FIG. 13 illustrates an enlarged portion of the bottom of FIG. 12 schematic illustration of vertical cross-sections of sensors, illustrating an aspect of the present disclosure.

The second dielectric structure has a minimal equivalent oxide thickness. As used herein, the term "minimal equivalent oxide thickness", or "MinEOT", relates to the smallest dielectric structure EOT existing on the second part of the periphery. For instance, if the second dielectric structure is a single layer of uniform thickness and material composition, it has a uniform EOT for the entire second part and the minimal equivalent oxide thickness is simply that EOT. However, if the second dielectric structure is not uniform on the entire first part, e.g. if it has a first EOT (EOT1) on a first sub-part of the second part of the periphery and has a second EOT (EOT2) on a second sub-part of the second part of the periphery, the minimal equivalent oxide thickness is the smallest of EOT1 and EOT2. FIG. 13 shows what the Min EOT is for FIG. 12. As can be seen in FIG. 13, the second part has a dielectric structure thereon that varies in thickness and hence in EOT. The EOT measured at the location on the second part where this EOT is the smallest (indicated by the white double arrow) is the Min EOT. The Min EOT in FIG. 13 is obtained by summing the EOT of the thermal oxide 4a with the EOT of the additional dielectric structure 4b.

In embodiments, the minimal equivalent oxide thickness of the second dielectric structure may be larger than 10 nm.

In embodiments, the first part of the periphery may represent from 10 to 45% thereof, while the second part of the periphery may represent from 55 to 90% thereof.

In embodiments, the first part and the second part of the periphery add up to at least 60%, at least 70%, at least 80%, at least 90%, and at least 95%. In some embodiments, the first part and the second part add up to 100% of the periphery. When the first part and the second part of the periphery add up to 100%, the periphery consists of the first part and the second part. A first example of an embodiment where the first part and the second part do not add to 100% is when:
- the maximal EOT of the first dielectric structure on the first part has a thickness of 0.5 to 4 nm,
- the minimal EOT of the second dielectric structure on the second part has a thickness larger than 10 nm, and
- a third dielectric structure exists on a third part which represents at most 10% of the area of the periphery, the third dielectric structure having a maximal EOT of 10 nm and a minimal EOT of more than 4 nm.

Figure 7:
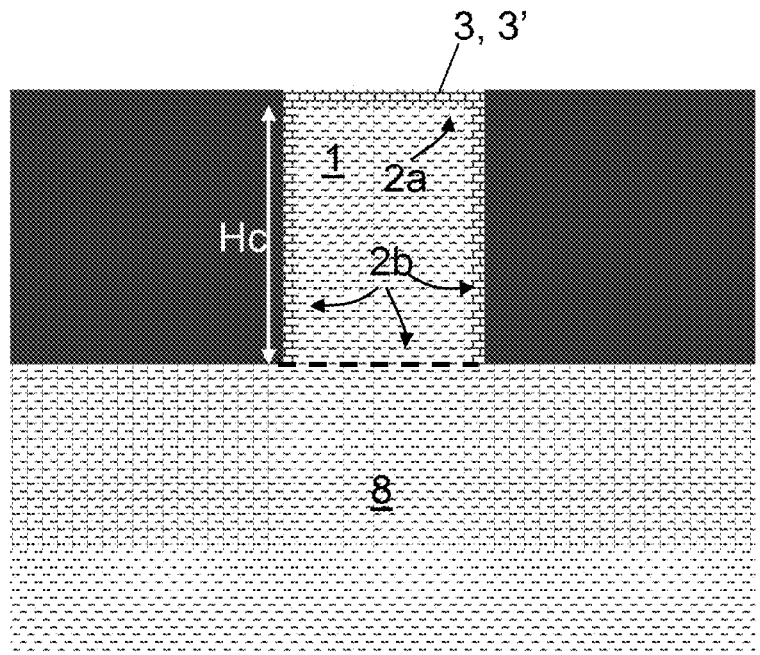
Figure 8:
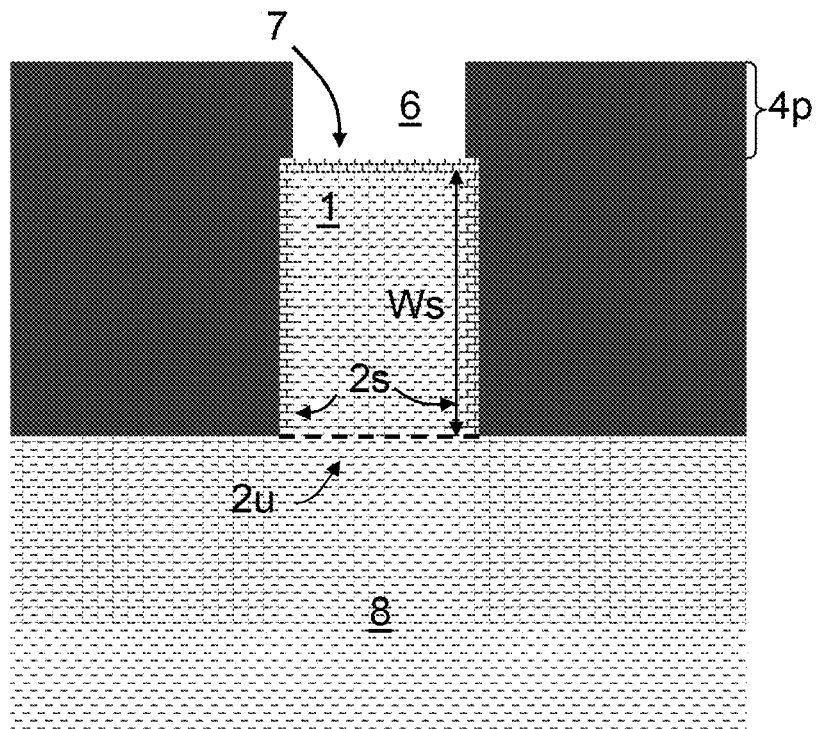

A second example of an embodiment where the first part and the second part do not add to 100% is depicted in FIGS. 7 and 8 where the bottom of the channel region is not in contact with a dielectric structure, said bottom forming a third part of the periphery.

In embodiments, step c of providing the second dielectric structure may comprise thermally oxidizing at least a sub-part of the second part of the periphery, then covering that oxidized second part with an additional dielectric structure. This is the case for all embodiments illustrated in the figures. The combination of the thermal oxide on the at least a sub-part of the second part of the periphery and of the additional dielectric structure can together form part or all of the second dielectric structure. Embodiments where this combination forms only part of the second dielectric structure are illustrated in FIGS. 1, 3, 5, and 6. Embodiments where this combination forms all of the second dielectric structure are illustrated in FIGS. 7 to 12.

In embodiments, step c of providing the second dielectric structure may comprise providing the active region on a dielectric substrate, thereby forming a part of the second dielectric structure from the part of the dielectric substrate on which the active region is provided.

In embodiments, step c of providing the second dielectric structure may comprise both:
- providing the active region on a dielectric substrate, thereby forming a first part of the second dielectric structure from the part of the dielectric substrate on which the active region is provided.
- thermally oxidizing the part of the periphery which is not on the dielectric substrate, then covering a first part of that oxidized part with an additional dielectric structure while leaving a second part of that oxidized part uncovered. The second part of that oxidized part forms the first dielectric structure.

These embodiments and others will now be illustrated by drawings.

In embodiments, the periphery may consist of a top surface, a bottom surface, and sidewall surfaces, wherein the first part of the periphery is the top surface and wherein the second part of the periphery comprise the sidewall surfaces. Examples of these embodiments are illustrated in FIGS. 1 to 4, and 7 to 10. In some embodiments, the sidewall surfaces have a width, the second dielectric covers the entire width, and a part of the second dielectric structure extends farther than the entire width so as to form a cavity delimited by the top surface of the semiconductor channel and the part of the second dielectric structure extending farther than the entire width. This is illustrated in FIGS. 2, 4, and 10.

In embodiments where the periphery comprises a top surface, a bottom surface, and sidewall surfaces, wherein the first part of the periphery is the top surface and wherein the second part of the periphery comprises the sidewall surfaces, the second part of the periphery may consist in the sidewall surfaces. This is illustrated in FIGS. 7 and 8.

In embodiments where the periphery comprises a top surface, a bottom surface, and sidewall surfaces, wherein the first part of the periphery is the top surface and wherein the second part of the periphery comprises the sidewall surfaces, the second part of the periphery may consist in the sidewall surfaces and the bottom surface. This embodiment is illustrated in FIGS. 1-4, 9, and 10.

In embodiments, the periphery may comprise a top surface, a bottom surface, and sidewall surfaces, the first part of the periphery may be the sidewall surfaces and the second part of the periphery may be the top surface and the bottom surface. This embodiment is illustrated in FIGS. 5, 6, and 11. An example of such embodiments is when the top surface has a width and the second dielectric structure is present over the entire width of the top surface and extends farther than the entire width. This embodiment is illustrated in FIG. 6.

In embodiments, the active region may be comprised in a nanowire, wherein the periphery comprises a top surface, a bottom surface, and sidewall surfaces, and wherein the first part is the bottom surface and the second part is the top surface and the sidewall surfaces. This embodiment is illustrated in FIG. 12.

The method according to the first aspect may further comprise, in addition to steps a to c, a step d of providing a cavity having an interior, wherein the cavity is suitable for containing a fluid, and wherein the gate dielectric is exposed to said interior, and a step e of providing a reference electrode, spatially separated from the gate dielectric, and exposed to said interior.

In embodiments, the semiconductor channel region may have a width and a height which are both smaller than 10 nm.

In embodiments, the first part may comprise a surface with crystalline orientations described by Miller indices {001}. This can be beneficial because it can minimize noise.

In embodiments, the first dielectric structure may comprise an enzyme attached thereto.

In embodiments, the enzyme may be selected from polymerases, peptidases, and proteases.

In embodiments, a bonding layer may be present on the first dielectric structure, and the enzyme may be coupled to the first dielectric structure by being bound to the binding layer.

In embodiments, the bonding layer may be a self-assembled monolayer.

The self-assembled monolayer can, for instance, be formed of organosilane molecules. Organosilane molecules can have the advantage of having a functional group (e.g —$SiCl_3$ or —$SiOR'3$) suitable for attaching covalently to most dielectric material and in particular to oxide materials such as silicon oxide. The organosilanes are chosen so that they possess a functional group permitting attachment to the enzyme (typically via a linker).

In embodiments, the silane may be of general formula Z—R—X wherein X is a group suitable for attaching to the first dielectric structure (e.g. X may be $SiOR'3$ or R—$SiCl_3$) wherein R is an organic chain (e.g. having from 1 to 20 carbon atoms) and R' is an alkyl (typically methyl or ethyl).

Z is a functional group suitable for attaching to the enzyme (e.g. via a linker). Z can be an azido group or an alkyne group (e.g. a strained alkyne group). When Z is an azido group, the enzyme or more typically the linker attached to the enzyme may have an alkyne group for reacting with the azido group. When Z is an alkyne group, the enzyme or more typically the linker attached to the enzyme may have an azido group for reacting with the azido group.

An example of silane may be an azido-$C_{3-11}$-trimethoxysilane, such as for instance 11-azidoundecyltrimethoxysilane. Such a silane may be deposited as a self-assembled monolayer by vapor phase deposition at 145° C. onto a $SiO_2$ surface.

In embodiments, the bonding layer may be an electrografted layer.

In embodiments, the electrografted layer may be formed from molecules having the general formula Z—R—X' wherein R and Z are as defined above and X' is a group suitable for attaching to the dielectric region by electrografting (e.g. X may be a diazonium salt).

The bonding layer may form an interface layer between on one hand the first dielectric structure and on another hand the enzyme.

In embodiments, a linker may be attached to the first dielectric structure or the binding layer, and the enzyme may be coupled to the first dielectric structure by being bound to the linker.

The linker is typically of formula A-L-E, wherein A is a functional group capable of attaching to the binding layer (e.g. an alkyne such as a strained alkyne group if the binding layer presents an azido group available for reaction, or an azido group if the binding layer presents an alkyne group available for reaction) or to the dielectric region (e.g. an —SiOR'3 or R—$SiCl_3$ group), and E is a functional group capable of attaching to the enzyme, eventually after modification of the enzyme.

Prior to attachment of the linker to the enzyme, the enzyme itself might need to be modified. Examples of E are oxiamine, catechol, alkyne (e.g. a strained alkyne), azide, puromycin, and aniline, amongst others.

Below are a few examples of how to attach a linker to an enzyme.

Gilmore et al. (*Angew. Chem. Int. Ed.* 2006, Vol. 45, pp. 5307-5311) describes a method involving the site-specific modification of the N-terminal position of a protein (which could be replaced by the enzyme of the present disclosure), comprising forming a pyruvamide from the terminal amino group of the protein, followed by reaction with a molecule comprising an oxiamine group (where the molecule could be the linker of the present disclosure and the oxiamine could be the functional group E of the linker).

Song et al. (*Acta Biomaterialia*, 2016, Vol. 43, pp. 50-60) describes a method involving the site-specific modification of the N-terminal position of a protein (which could be replaced by the enzyme of the present disclosure), comprising reacting the protein with a molecule comprising a catechol functional group (where the molecule could be the linker of the present disclosure and the catechol could be the functional group E of the linker).

Temming et al. (*Org. Biomol. Chem.*, 2013, Vol. 11, pp. 2772) describes a method involving the site-specific modification of the N-terminal position of a protein (which could be replaced by the enzyme of the present disclosure), comprising forming a nitrone group from the terminal amino group of the protein, followed by reaction with a molecule comprising a strained alkyne group (where the molecule could be the linker of the present disclosure and the strained alkyne group could be the functional group E of the linker).

Humenik et al. (*ChemBioChem*, 2007, Vol. 8, pp. 1103-1106) describes a method involving the site-specific modification of the C-terminal position of a protein (which could be replaced by the enzyme of the present disclosure), comprising reacting the enzyme with a puromycin linker comprising an azide group (where the puromycin linker could be the linker of the present disclosure, the azide group could be the functional group A of the linker).

El Sohly et al. (*Acc. Chem. Res.*, 2015, Vol. 48, pp. 1971-1978) describe the use of oxidative coupling strategies for site-selective protein modification. One described method that could be adapted to the present disclosure could involve the attachment of an o-azidophenol group at the N-terminal amino acid of the enzyme, followed by reaction with a linker comprising an aniline group, which can photoreact with the o-azidophenol group, and a silane group, which can react with the dielectric region.

Yet other methods that can be similarly adapted to the present disclosure are disclosed in Chen et al. (*Chem. Sci.*, 2017, Vol. 8, pp. 2717); Boutureira et al. (*Chem. Rev.* 2015, Vol. 115, pp. 2174-2195); Rosen et al. (*Nature Chemical Biology*, July 2017, Vol. 13, pp. 697-705); Sasaki et al. (*Bioorg. Med. Chem. Left.*, 2008, Vol. 18, pp. 4550-4553); and Chan et al. (*J. Am. Chem. Soc.*, 2012, Vol. 134, pp. 2589-2598).

The enzyme is typically bound to the binding layer and/or the linker in such a way that the active site is accessible from the liquid medium, i.e. the active site is exposed to the cavity, i.e. to the fluidic gate.

In embodiments, the part of the enzyme closest to the first dielectric structure may be within 2 nm, generally within 1 nm of the first dielectric structure. This means that in embodiments, the enzyme may be separated from the first dielectric structure by a binding layer and/or a linker whose combined height is 2 nm or less, or 1 nm or less. Greater proximity between the target molecule and the channel can translate into greater sensitivity.

The method of the present disclosure may comprise a step of coupling an enzyme to the first dielectric structure.

In embodiments, coupling the enzyme to the first dielectric structure may comprise a preliminary step of forming a binding layer on the first dielectric structure. The bonding layer may be as defined above. For instance, the bonding layer may suitable for, on one hand, binding to the first dielectric structure, and on another hand, binding to the enzyme.

A typical example of a bonding layer may be a self-assembled monolayer of molecules comprising a trimethoxysilane group for binding with the dielectric region and an azide group for binding with the enzyme. Such a binding layer may, for instance, be deposited in an oven from the vapor phase.

Once the binding layer is formed, the enzyme can be bound therewith.

Binding the enzyme with the binding layer may be performed in such a way that only one enzyme is present in the fluidic gate region on the binding layer. To achieve this, Poisson loading can be used as is well known to the person skilled in the art. For instance, Poisson loading may comprise exposing the bonding layer with a volume of liquid having from 10 to 50% (typically from 20 to 37%) of chances of comprising a single enzyme. This typically results in either one or zero enzyme bound to the binding layer. In the case of a biosensing device comprising a plurality of sensors according to the first aspect, Poisson loading may comprise exposing the plurality of sensors to a volume of liquid having an enzyme concentration such that 10 to 50% (typically from 20 to 37%) of the sensors comprise a single enzyme in their fluidic gate region.

The binding of the enzyme on the binding layer is typically selective. Selectivity can, for instance, be achieved by using an enzyme having a linker attached therewith, said linker having an A group (such as an alkyne group) as defined in the first aspect. When the enzyme comprises a linker comprising an alkyne group or a strained alkyne group, that group can, for instance, be reacted with azide groups of the binding layer. The reaction can be performed in the conditions of click chemistry, e.g. in presence (for an unstrained alkyne) or absence (for a strained alkyne) of a Cu catalyst.

Binding the electrolyte-screening layer to the binding layer can, for instance, be achieved by contacting the binding layer with a liquid comprising polyethylene glycol molecules comprising an alkyne or a strained alkyne such as a dibenzocyclo-octyne group. The reaction can be performed in the conditions of click chemistry, e.g. in presence (for an unstrained alkyne) or absence (for a strained alkyne) of a Cu catalyst.

The cavity, i.e. the fluidic gate region, can be located adjacent to the first dielectric structure and it is suitable for exposing the active site of the enzyme to the liquid medium. The fluidic gate region typically is or comprises a cavity in a layer of the sensor, said cavity exposing the active site of the enzyme. In embodiment, the lateral extent of the cavity typically measures 150 nm or less, generally 100 nm or less. In embodiments, the sensor may have a layer adjacent the first dielectric structure and this layer may have a cavity therein exposing the active site of the enzyme and typically also exposing the entire enzyme. In some embodiments, the cavity, i.e. the fluidic gate region, can be filled with the liquid medium. The liquid medium is typically an electrolyte containing the analyte and serving as a liquid gate. In some embodiments, the cavity, i.e. the fluidic gate region, is at least partially empty (of liquid) or not filled with a liquid. In some embodiments, at least part of the cavity, i.e. the fluidic gate region, can be filled with air. This would, for instance, be the case when the sensor is not in use and there is no liquid in the cavity, i.e. in the fluidic gate region. In some embodiments, an inlet and an outlet for the liquid are provided to the cavity, i.e. to the fluidic gate region. For instance, the inlet may be located on one side of the cavity, i.e. of the fluidic gate region, and the outlet may be located on the opposing side of the cavity, i.e. of the fluidic gate region. Typically, the fluidic gate region is defined at least partially by the first dielectric structure or any layer thereon, and sidewall surfaces. In some embodiments, a cover may be located above the cavity, i.e. the fluidic gate region, and the cavity, i.e. the fluidic gate region may be defined by the cover, the dielectric region or any layer thereon, and sidewalls (e.g. connecting the cover and the first dielectric structure or any layer thereon). When a cover is present, an inlet and an outlet can be present in the cover.

The sensor of the present disclosure can be used for peptide or protein sequencing.

For this purpose, the enzyme may be a peptidase or a protease.

The enzyme activity may be monitored electronically which allows identifying/fingerprinting the peptide. In a biosensing device where multiple peptidases and/or proteases are used, each of said peptidase and/or protease can be suitable for cleaving a different amino acid. Such peptidase and/or protease are known. For instance, endoplasmic reticulum aminopeptidase 1 generally cleaves Leucine, endoplasmic reticulum aminopeptidase 2 generally cleaves arginine, and tobacco etch virus nuclear-inclusion-a endopeptidase generally cleaves cysteine.

The sensor of the present disclosure can be used for polynucleotide (e.g. DNA or RNA) sequencing. For this purpose, the enzyme may be a polynucleotide polymerase, such as a DNA polymerase. The building in of the nucleotides by the enzyme can be electronically monitored which allows determining the sequence of the DNA running through the enzyme. For instance, the change of the nucleotides or the configuration change of the enzyme can be detected.

The field-effect transistor of the sensor typically comprises a solid gate electrode placed in the fluidic gate region in such a way that can be in electrical contact with the liquid electrolyte gate when it is present. The field-effect transistor typically further comprises a source electrode and a drain electrode in electrical contact with respectively the source region and the drain region of the active region of the FET.

In embodiments, the semiconductor channel region may have a width and a height which are both smaller than 10 nm, usually smaller than 6 nm.

The height is generally below 4 nm, typically below 3 nm. For instance, the height may be from 0.5 to 10 nm or from 1 to 4 nm.

The width is generally below 8 nm, typically below 6 nm. For instance, the width may be from 0.5 to 10 nm or from 1 to 4 nm.

In embodiments, the height is generally below 4 nm, typically below 3 nm, and/or the width is generally below 8 nm, typically below 6 nm.

In embodiments, the height may be from 0.5 to 10 nm or from 1 to 4 nm, and/or the width may be from 0.5 to 10 nm or from 1 to 4 nm.

Such small dimensions give the best signal sensitivity. That such low heights are beneficial may be considered surprising because such heights are well below what is considered optimal for digital logic Si MOSFETs (digital logic typically requires relatively high (30-50 nm) and narrow fins (5-10 nm) to maximize drive current (high height) and minimize footprint (low width)).

Such dimensions can, for instance, be realized by providing an active region in step a by:
  providing an SOI substrate having a semiconductor layer thinner than 10 nm and patterning this semiconductor layer by self-aligned double patterning, extreme ultraviolet lithography, or e-beam lithography, or
  providing a bulk Si wafer and patterning this semiconductor layer by self-aligned double patterning, extreme ultraviolet lithography, or e-beam lithography, or
  providing a semiconductor channel region having a width and/or a height larger than 10 nm (e.g. obtained by immersion lithography), and thinning it down (e.g. by one or more cycles of an oxidation step followed by an oxide dissolution step).

When the semiconductor channel region is in a nanowire (e.g. a suspended nanowire), such dimensions can, for instance, be realized by providing an active region in step a by:
  providing an SOI substrate having a semiconductor layer thinner than 10 nm and patterning this semiconductor layer by self-aligned double patterning, extreme ultraviolet lithography, or e-beam lithography, followed by removing the oxide underlying the semiconductor layer, or providing a stack of alternating Si and SiGe layers, patterning this stack by self-aligned double patterning, extreme ultraviolet lithography, or e-beam lithography, then removing the SiGe layers, or providing a nanowire semiconductor channel region having a width and/or a height larger than 10 nm (e.g. obtained by immersion lithography), and thinning it down (e.g. by one or more cycles of an oxidation step followed by an oxide dissolution step).

In a second, aspect, the present disclosure relates to a sensor comprising:
a. an active region comprising a source region, a drain region, and a semiconductor channel region between the source region and the drain region, the semiconductor channel region having:
(i) a length, and
(ii) a periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery,
b. a first dielectric structure on the entire first part, the first dielectric structure having a maximal equivalent oxide thickness, measured perpendicularly to the first part, thereby forming a gate dielectric suitable for being exposed to a fluid to be sensed,
c. a second dielectric structure on the entire second part, the second dielectric structure having a minimal equivalent oxide thickness, measured perpendicularly to the second part, larger than the maximal equivalent oxide thickness of the first dielectric structure, thereby forming an isolation structure.

Any feature of the second aspect can be as correspondingly described in the first aspect.

In a third aspect, the present disclosure relates to a biosensing device comprising a sensor according to any embodiments of the second aspect. In embodiments, the biosensing device may comprise a plurality of sensors according to embodiments of the second aspect. In embodiments, a plurality of sensors, each with a different enzyme, may be present in the biosensing device. In such embodiments, the cavity, i.e. the fluidic gate, of each of the plurality of sensors may be in fluidic communication with one another. This can be seen as the plurality of sensors sharing a same cavity, i.e. a same fluidic gate.

For instance, in an embodiment, a plurality of sensors, each with a different enzyme, may be formed on a single semiconductor substrate.

In embodiments, the biosensing devices may further comprise FETs having a solid gate (e.g. formed of a gate dielectric and a gate electrode).

Any feature of the third aspect can be as correspondingly described in the first or second aspect.

Figure 2:
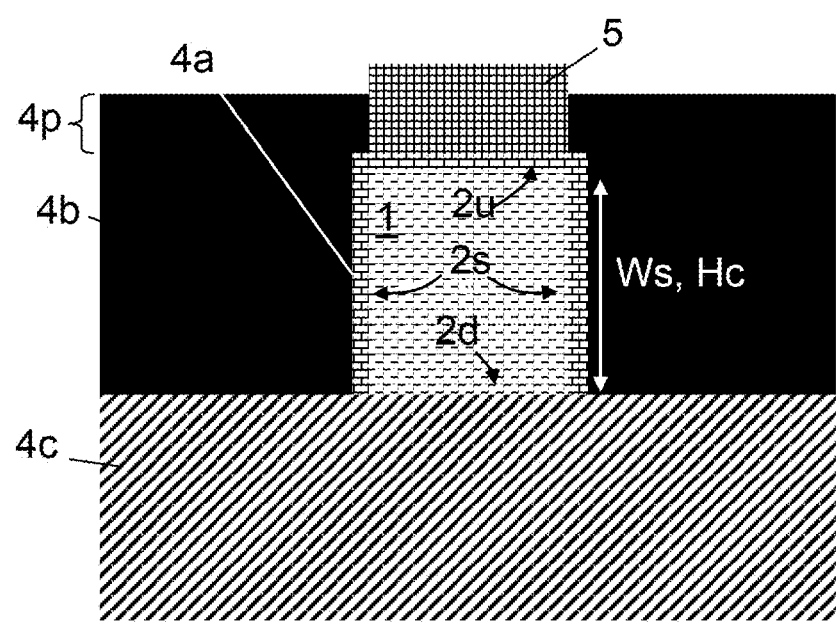

FIG. 1 shows a vertical cross-section taken through the semiconductor channel (1) and perpendicularly to its length. It shows a substrate (4c) made of a dielectric material. The substrate (4c) can, for instance, be a SiO₂ layer present in an SOI substrate. A semiconductor channel (1) can be present on the substrate (4c). This channel (1) can be manufactured for instance by patterning a semiconductor layer present in the SOI substrate. For instance, an SOI substrate can be provided, a patterned photolithographic mask can be formed on the semiconductor layer, and this pattern can be etched in the semiconductor layer, thereby forming a semiconductor fin. The dielectric substrate (4c) underlying the semiconductor fin can form part of the second dielectric structure (4). The active region can be formed in the semiconductor fin. For this purpose, ions can be implanted in two separated regions of the fin, thereby forming the source region and the drain region. The region which has not be implanted, i.e. the region between the source region and the drain region, is the channel region (1).

The fin can then be annealed to activate the implanted regions.

The exposed surface of the semiconductor region can then be thermally oxidized, thereby forming an oxide liner (3, 4a) which can serve as the first dielectric structure (3) on a first part (2a) of the periphery (2) of the channel (1) and as part (4a) of the second dielectric structure (4) on a second part (2b) of the periphery (2).

A layer of a dielectric material, e.g. a layer of SiO₂ can then be deposited on the dielectric substrate (4c) and the fin, thereby entirely covering the fin. This layer of dielectric material can then be planarized, e.g. by CMP. This planarization can be performed in such a way as to expose the thermal oxide (3) present on the top surface (2u, 2a) of the channel (1). It is however not easy to stop at exactly the wished distance from the channel (1), although it can be done e.g. by using a timed etch. It may be easier, especially when the layer of dielectric material is made of the same material as the oxide liner (3), to planarize the dielectric material until the top surface (2u, 2a) of the channel (1) itself is exposed. This can form part of the second dielectric structure (4b) on the sidewalls of the oxidized semiconductor channel (1). Then, the top surface (2a, 2u) of the channel (1) can be oxidized thermally to form the first dielectric structure (3). Optionally, before to thermally oxidize the top surface (2a, 2u) of the channel (1), the top surface (2a, 2u) of the channel (1) can be treated in such a way as to remove damage created by the CMP process. In cases where the liner (3) is a different material than the layer of dielectric material, the different material for the liner (3) can be used for endpoint detection, as it can generate a distinct spectroscopic signal, to stop a dry etch on the different material of the liner (3). In other embodiments, the liner (3) may also be selected in such a way that it has a slower etch rate than the dielectric layer, thereby making it easier to stop on the liner (3).

The channel enclosure provided by the second dielectric structure (4) can reduce shunting current. It also can reduce the screening effect exerted by the electrolyte on the analyte. This screening effect can increase with decreasing channel cross-section, i.e. with decreasing channel height and/or width. This can be observed in FIG. 14 where the simulated gate voltage shift is expressed as a function of the channel width (2, 5, 10, 20, 50, 80, 100, and 130 nm) and of the channel height (2, 5, 10, 20, 40, and 60 nm) for a channel length of 350 nm.

Figure 16:
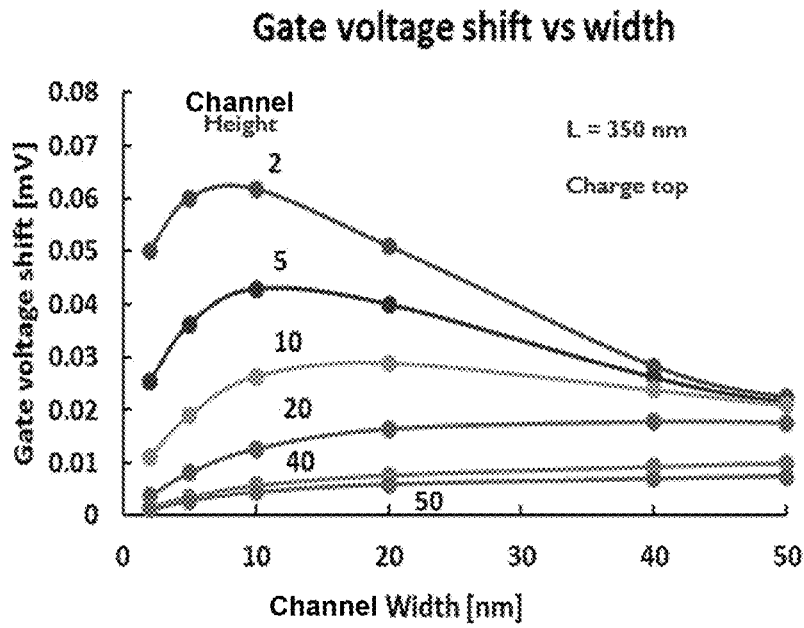
FIG. 16 is a graph of the gate voltage shift (mV) observed when an enzyme captures a charged substrate as a function of the channel width (nm) for different channel height or as a function of the channel height (nm) for different channel width respectively.
Figure 17:
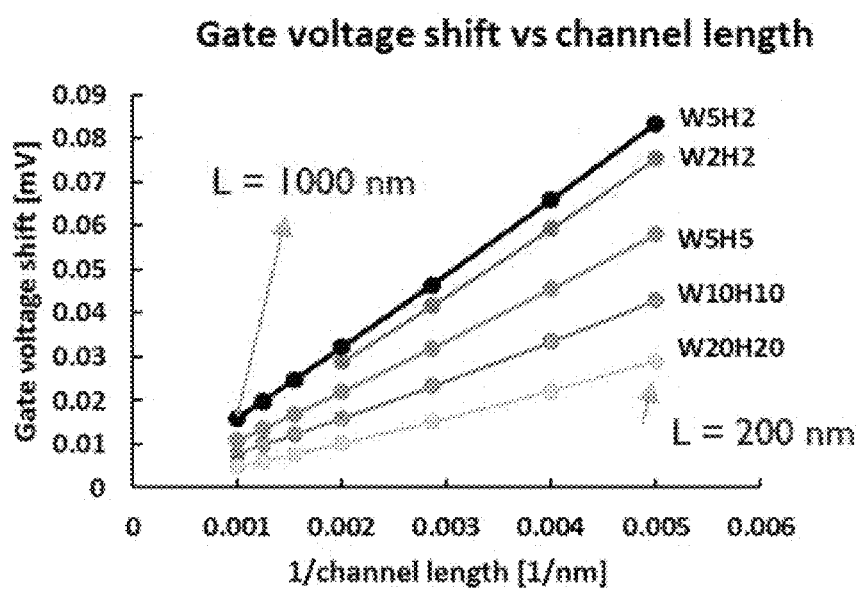
FIG. 17 is a graph of the gate voltage shift (mV) observed when an enzyme captures a charged substrate as a function of the channel length (nm) for different channel cross-section (W: width in nm, H: height in nm).
Figure 18:
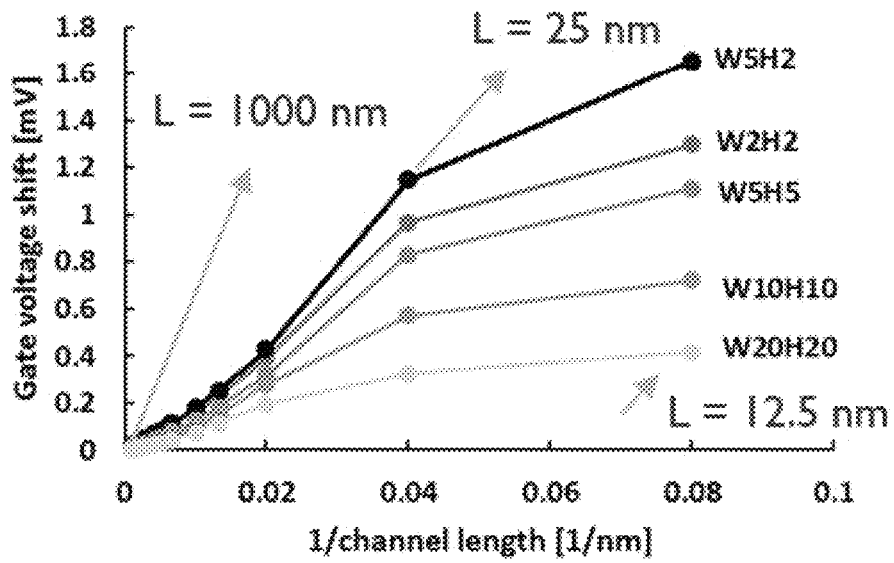
FIG. 18 is a graph of the gate voltage shift (mV) observed when an enzyme captures a charged substrate as a function of the channel length (nm) for different channel cross-section (W: width in nm, H: height in nm).
Figure 19:
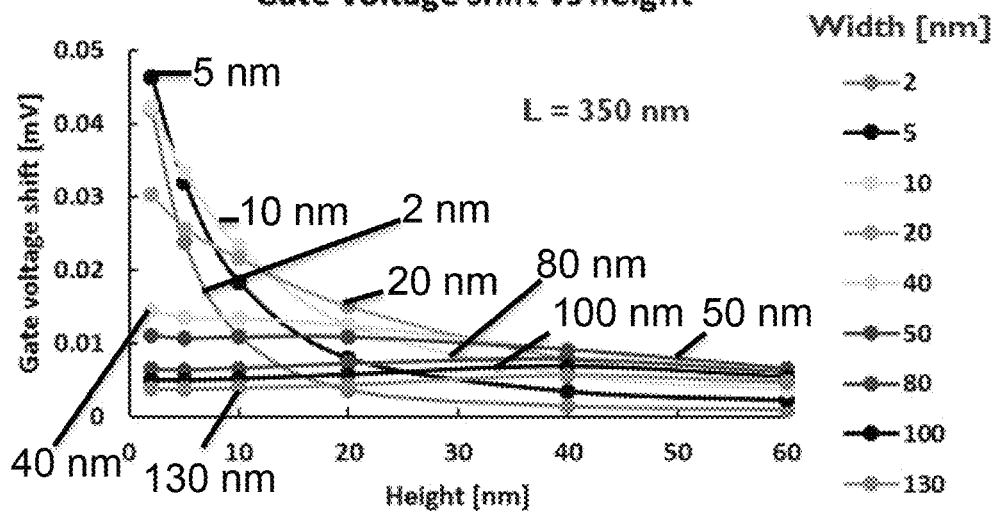
FIG. 19 is a graph of the gate voltage shift (mV) observed when an enzyme captures a charged substrate as a function of the channel width (nm) for different channel height or as a function of the channel height (nm) for different channel width respectively.
Figure 20:
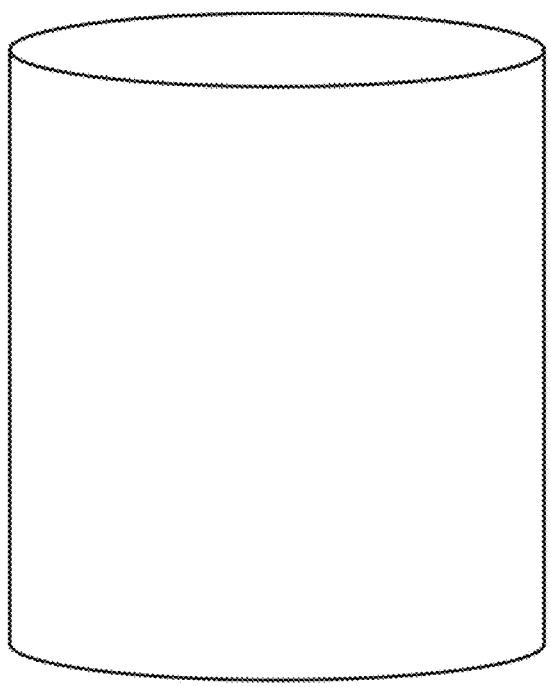
FIG. 20 illustrates a cylindrical shaped semiconductor channel having a periphery of a single curved surface.

For comparison purposes, FIGS. 16 and 19 show the effect of channel width (Wc) and channel height (Hc) on the gate voltage shift for a comparative example where no second dielectric structure is used. Although a similar trend linking small cross-sections with higher sensitivity can be observed in FIG. 16, the small cross-section effect can be much more pronounced in the case of FIG. 14.

In other words, the device depicted in FIG. 1 is a representative example of a sensor that can be obtained by a method comprising the steps of:
providing a semiconductor-on-insulator substrate comprising a semiconductor layer on a dielectric substrate (4c) (the dielectric substrate being a layer of an oxide of the semiconductor), patterning the semiconductor layer to form an active region comprising a drain region, a source region, and a semiconductor channel region (1) between the drain region and the source region, the semiconductor channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, forming a dielectric layer (3, 4a) around the periphery (2) (e.g. by thermally oxidizing the periphery), overlying the active region and the layer (4c) of the oxide of the semiconductor with a dielectric coating at least as thick as the height (Hc) of the channel region (1), planarizing the dielectric coating so as to expose the dielectric layer (3), thereby forming a part (4b) of the second dielectric structure, replacing the dielectric layer (3) present on the first part (2a) by:
  removing the dielectric layer (3) present on the first part (2a), thereby exposing the top surface (2a, 2u) of the semiconductor channel region (1),
  removing a top portion of the semiconductor channel region (1), thereby exposing a fresh surface of the semiconductor channel, and
  forming a first dielectric structure (3') at the fresh surface (e.g. by thermal oxidation), the first dielectric structure having a maximal equivalent oxide thickness, measured perpendicularly to the first part, thereby forming a gate dielectric suitable for being exposed to a fluid to be sensed, wherein the dielectric substrate (4c), the dielectric layer (4a) present on the sidewalls (2s), and the planarized dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

FIG. 7 is similar to FIG. 1 but the substrate (8) can be made of the same material as the semiconductor channel (1). Such a structure can be obtained by following a bulk Si FinFET flow instead of an SOI FinFET flow. In the case of FIG. 7, the second dielectric structure (4) may only cover the sidewall surfaces (2s) of the semiconductor channel (1). This is an example where the first part (2a) and the second part (2b) of the periphery (2) of semiconductor channel region (1) do not add up to 100% of the periphery (2) since the bottom surface (2d) of the semiconductor channel region (1) does not belong to either the first (2a) or the second part (2b).

In other words, the device depicted in FIG. 7 is a representative example of a sensor that can be obtained by a method comprising the steps of:
  providing a semiconductor substrate (8),
  patterning an active region in the semiconductor substrate (8), the active region comprising a drain region, a source region, and a semiconductor channel region (1) between the drain region and the source region, the semiconductor channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, forming a dielectric layer (3) around the periphery (e.g. by thermally oxidizing the periphery), overlying the active region and the substrate (8) with a dielectric coating at least as thick as the height (Hc) of the semiconductor channel region (1), planarizing the dielectric coating so as to expose the dielectric layer (3), replacing the dielectric layer (3) by:
    removing the dielectric layer (3) present on the first part (2a), thereby exposing the top surface (2a, 2u) of the semiconductor channel region (1),
    removing a top portion of the semiconductor channel region (1), thereby exposing a fresh surface of the semiconductor channel region (1), and
    forming a first dielectric structure (3') at the fresh surface (e.g. by thermal oxidation), the first dielectric structure having a maximal equivalent oxide thickness, measured perpendicularly to the first part, thereby forming a gate dielectric suitable for being exposed to a fluid to be sensed, wherein the dielectric layer (4a) present on the sidewalls (2s), and the planarized dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

FIG. 2 shows a vertical cross-section taken through the semiconductor channel (1) and perpendicularly to its length for an embodiment similar to FIG. 1. A key difference is that prior to depositing the layer of a dielectric material on the dielectric substrate (4c) and the fin, the semiconductor channel region (1) can have a hardmask (5) thereon.

A layer of a dielectric material, e.g. a layer of $SiO_2$ can then be deposited on the dielectric substrate (4c), the fin, and the hardmask (5), thereby entirely covering the fin and the hardmask (5). This layer of dielectric material can then be planarized, e.g. by CMP. This planarization can be performed in such a way as to expose the hardmask (5). Next, the dielectric material may optionally be etched back so as to expose a part, but not the entirety, of the sidewalls of the hardmask (5). This forms part (4b) of the second dielectric structure (4) on the sidewalls of the oxidized semiconductor channel region (1). Then, the hardmask (5) can be removed. If native oxide was present between the hardmask and the channel, this native oxide can be removed, then the top surface of the channel can be oxidized thermally to form the first dielectric structure (3). Optionally, before thermally oxidizing the surface of the semiconductor channel region (1), the top surface (2u) of the channel (1) can be treated in such a way as to remove damage created by the removal of the hardmask (5).

In this embodiment, the second dielectric structure (4) covers the entire width (Ws) of the semiconductor channel sidewall surfaces (2s), and a part (4p) of the second dielectric structure (4b) extends farther than the entire width (Ws) of the semiconductor channel sidewall surfaces (2s) so as to form a cavity (still filled with the hardmask (5) in FIG. 2) delimited by the top surface of the first dielectric structure (3) and the part (4p) of the second dielectric structure (4) extending farther than said entire width (Ws).

Figure 14:
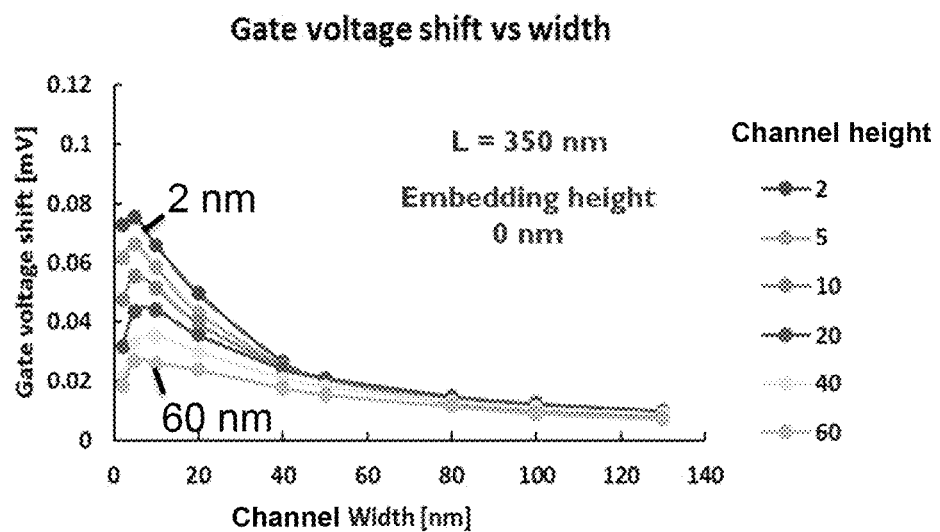
FIG. 14 is a graph of the gate voltage shift (mV) observed when an enzyme captures a charged substrate as a function of the channel length (nm).
Figure 15:
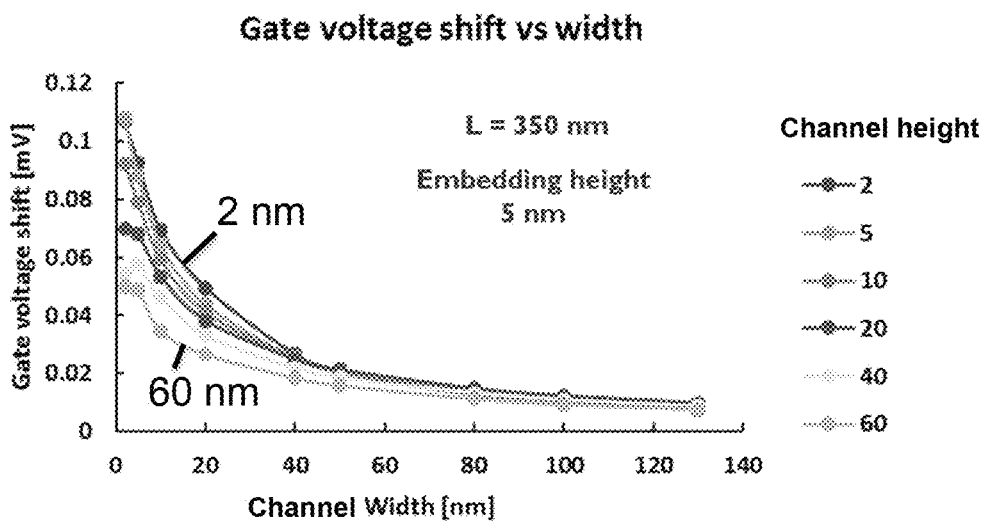
FIG. 15 is a graph of the gate voltage shift (mV) observed when an enzyme captures a charged substrate as a function of the channel width (nm).

Having the second dielectric structure (4) extending farther than the entire sidewall width (Ws) can increase still further the signal magnitude. This can be seen by comparing FIG. 14 with FIG. 15. FIG. 14 corresponds to the situation of FIG. 1 where the second dielectric structure (4) does not extend farther than the width (Ws) of the channel sidewall surfaces. FIG. 15 corresponds to the situation of FIG. 2, after the hard mask (5) has been removed, where the second dielectric structure (4b) does extend 5 nm farther than the entire width (Ws) of the channel sidewall surfaces (2s). For the same extension, the smaller the channel (1) cross-section, the larger the increase in signal. This can be observed in FIG. 15 where the simulated gate voltage shift is expressed as a function of the channel width (2, 5, 10, 20, 50, 80, 100, and 130 nm) and of the channel height (Hc) (2, 5, 10, 20, 40, and 60 nm) for a channel length of 350 nm.

In other words, the device depicted in FIG. 2 is a representative example of a sensor that can be obtained by a method comprising the steps of:
  providing a semiconductor-on-insulator substrate comprising a semiconductor layer on a layer (4c) made of an oxide of that semiconductor (e.g. a $SiO_2$ layer, also called buried oxide, in the case of a Si substrate),
  providing a patterned hardmask layer (5) on the semiconductor layer,
  patterning the semiconductor layer with the patterned hardmask layer to form an active region, the active region comprising a drain region, a source region, and a semiconductor channel region (1) between the drain region and the source region, the channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery,
  forming a dielectric layer around the exposed part of the periphery (2) (e.g. by thermally oxidizing the periphery),
  overlying the active region and the dielectric substrate (4c) with a dielectric coating at least as thick as the height (Hc) of the semiconductor channel region (1),
  planarizing the dielectric coating so as to expose only part of the hardmask (5),
  removing the hardmask (5), thereby exposing the top surface of the semiconductor channel region (1),
  removing a top portion of the semiconductor channel region (1), thereby exposing a fresh surface of the semiconductor channel region (1), and
  forming a first dielectric structure (3) at the top surface of the semiconductor channel region (1) (e.g. by thermal oxidation), the first dielectric structure having a maximal equivalent oxide thickness, measured perpendicularly to the first part, thereby forming a gate dielectric suitable for being exposed to a fluid to be sensed,
  wherein the dielectric substrate (4c), the dielectric layer (4a) present on the sidewalls (2s), and the planarized dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

FIG. 8 is similar to FIG. 2 but the substrate (8) can be made of the same material as the semiconductor channel region (1). Such a structure can be obtained by following a bulk Si FinFET flow instead of an SOI FinFET flow. In the case of FIG. 8, the second dielectric structure (4) may only cover the sidewall surfaces (2s) of the semiconductor channel region (1). This is a representative example where the first part (2a) and the second part (2b) of the periphery (2) of semiconductor channel region (1) do not add up to 100% of the periphery since the bottom surface (2u) of the semiconductor channel region (1) does not belong to either the first (2a) or the second part (2b).

In other words, the device depicted in FIG. 8 is a representative example of a sensor that can be obtained by a method comprising the steps of:
  providing a semiconductor substrate (8),
  providing a patterned hardmask layer (5) on the semiconductor substrate (8),
  patterning the semiconductor substrate (8) with the patterned hardmask layer (5) to form an active region in the semiconductor substrate (8), the active region comprising a drain region, a source region, and a semiconductor channel region (1) between the drain region and the source region, the semiconductor channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery,
  forming a dielectric layer (3, 4a) around the exposed part of the periphery (2) (e.g. by thermally oxidizing the periphery),
  overlying the active region and the substrate with a dielectric coating at least as thick as the height (Hc) of the channel region (1),
  planarizing the dielectric coating so as to expose only part of the hardmask (5),
  removing the hardmask, thereby exposing the top surface of the semiconductor channel region (1) and forming a cavity (7),
  removing a top portion of the semiconductor channel region (1), thereby exposing a fresh surface of the semiconductor channel region (1), and
    forming a first dielectric structure (3) at the top surface of the semiconductor channel region (1) (e.g. by thermal oxidation), the first dielectric structure having a maximal equivalent oxide thickness, measured perpendicularly to the first part, thereby forming a gate dielectric suitable for being exposed to a fluid to be sensed,
    wherein the dielectric layer (4a) present on the sidewalls (2s), and the planarized dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

We now refer to FIG. 12 which depicts a vertical cross-section, taken perpendicularly to the length of a nanowire. This nanowire can be obtained by etching away the box oxide in an SaI FinFET flow. These nanowire channels can be thinned down by thermal oxidation or digital etch (a process where a cycle comprising a thermal oxidation and an etching of the obtained thermal oxide can be performed one or more times). The resulting structure comprises a first dielectric structure (3) on the bottom surface (2d) of the channel (1) and a second dielectric structure (4) covering the sidewall surfaces (2s) and the top surface (2u) of the channel (1). FIG. 13 shows an enlarged view of the bottom of the channel of FIG. 12.

The device depicted in FIG. 12 is a representative example of a sensor that can be obtained by a method comprising the steps of:
  providing a semiconductor layer on a dielectric substrate,
  patterning the semiconductor layer to form an active region, the active region comprising a drain region, a source region, and a semiconductor channel region (1) between the drain region and the source region, the channel region (1) having a length, a periphery, and a height, the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery,
  forming a dielectric layer (3, 4a) around the exposed part of the periphery (e.g. by thermally oxidizing the exposed part of the periphery),
  overlying the active region and the substrate with a non-conformal dielectric coating so as to have no coverage of the bottom surface of the semiconductor channel or a coverage of the bottom surface of the semiconductor channel thin enough so that the second dielectric structure (4) has a minimal equivalent oxide thickness larger than the maximal equivalent oxide thickness of the first dielectric structure (3), and
  optionally removing at least part of the dielectric coating so as to expose the bottom surface of the semiconductor channel region without exposing the sidewalls and the top surface of the semiconductor channel region,
  forming a first dielectric structure (3) at the bottom surface (e.g. by thermal oxidation), the first dielectric structure having a maximal equivalent oxide thickness, measured perpendicularly to the first part, thereby forming a gate dielectric suitable for being exposed to a fluid to be sensed,
  wherein the dielectric layer (4a) and the dielectric coating (4b) remaining on the sidewalls (4s) and the top surface (4u) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

FIG. 11 shows an embodiment similar to FIG. 12 but where the first part (2a) of the periphery (2) consists of the sidewall surfaces (2s) and the second part (2b) of the periphery (2) consists of the top (2u) and bottom (2u) surfaces.

The device depicted in FIG. 11 is a representative example of a sensor that can be obtained by a method comprising the steps of:
  providing a semiconductor substrate (8),
  providing a first dielectric layer on the semiconductor substrate (8),
  providing a semiconductor layer on the dielectric layer,
  providing a second dielectric layer on the semiconductor layer,
  patterning the first dielectric layer, the semiconductor layer and the second dielectric layer to form an active region having a dielectric layer thereon and thereunder, the active region comprising a drain region, a source region, and a semiconductor channel region (1) between the drain region and the source region, the channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, and
  forming a third dielectric layer around the exposed part of the periphery (2) (e.g. by thermally oxidizing the exposed part of the periphery), thereby forming a first dielectric structure, the first dielectric structure having a maximal equivalent oxide thickness, measured perpendicularly to the first part, thereby forming a gate dielectric suitable for being exposed to a fluid to be sensed,
  wherein the first and second patterned dielectric layers (4b) present respectively on the bottom (4d) and top (4u) surfaces together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

Figure 9:
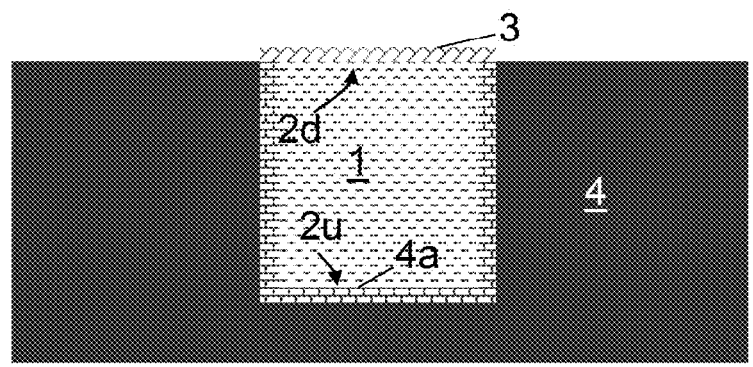
Figure 10:
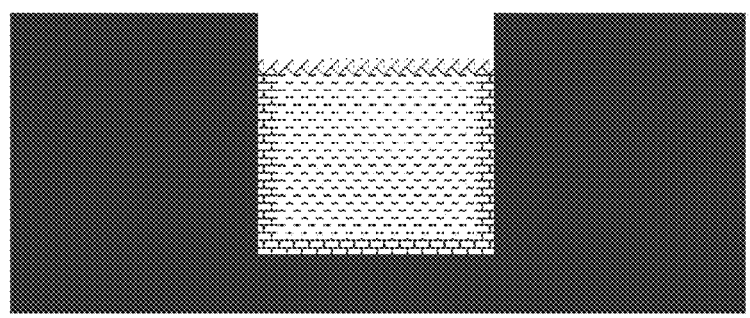

FIG. 9 is a vertical cross-section, taken perpendicularly to the length of a semiconductor channel (1), in an embodiment of the present disclosure. In this embodiment, the first dielectric structure (4) can cover the top surface (2u) of the channel (1) and the second dielectric structure (4) can cover the sidewall surfaces (2s) and the bottom (2d) of the channel (1). The difference with the embodiment of FIG. 1 is that none of the surfaces of the channel (1) is covered by a dielectric material originating in a SOI substrate. On the contrary, to obtain the structure of FIG. 9, the $SiO_2$ of the SOI substrate can be removed.

First, a SOI substrate may be provided, second the Si top layer of the SOI substrate may be patterned to form the semiconductor channel (1). This channel (1) can be manufactured for instance by patterning the semiconductor layer present in the SOI substrate. For instance, a SOI substrate can be provided, a patterned photolithographic mask can be formed on the semiconductor layer, and this pattern can be etched in the semiconductor layer, thereby forming a semiconductor fin. The active region can be formed in the semiconductor fin. For this purpose, ions can be implanted in two separated regions of the fin, thereby forming the source region, and the drain region. The region which is not implanted, i.e. the region between the source region and the drain region, is the channel region (1).

The fin can then be annealed to activate the implanted regions.

The exposed surface of the semiconductor region can then be thermally oxidized, thereby forming an oxide liner (3, 4a)) which can form part of the second dielectric structure (4) on a second part (2b) of the periphery (2) of the channel (1).

A layer of a dielectric material, e.g. a layer of $SiO_2$ can then be deposited on the dielectric substrate and the fin, thereby entirely covering the fin. This layer of dielectric material can then be planarized, e.g. by CMP, but this planarization should stop before to reach the oxide liner (4a). Then, the device under construction may be mounted on a temporary carrier via the layer of dielectric material. Then, the oxide layer present in the SOI substrate may be removed, thereby exposing the bottom surface (2d) of the semiconductor channel (shown on top of FIG. 9). Then, the bottom surface (2d) of the channel can be oxidized thermally to form the first dielectric structure (3). Optionally, before to thermally oxidize the surface of the channel (1), the top surface of the channel can be treated in such a way as to remove damage created by the removal of the SOI oxide.

The device depicted in FIG. 9 is a representative example of a sensor that can be obtained by a method comprising the steps of:

providing a semiconductor-on-insulator substrate comprising a semiconductor layer on a layer of an oxide of that semiconductor layer (e.g. a $SiO_2$ layer, also called buried oxide, in the case of a Si substrate), patterning the semiconductor layer to form an active region, the active region comprising a drain region, a source region, and a semiconductor channel region (1) between the drain region and the source region, the channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, forming a dielectric layer (4a) around the exposed part of the periphery (2) (e.g. by thermally oxidizing the exposed part of the periphery), overlying the active region and the substrate with a dielectric coating at least as thick as the height (Hc) of the channel region, removing a top portion of the dielectric coating without exposing the dielectric layer (4a), removing the layer of the oxide of the semiconductor layer, thereby exposing the bottom surface (2u) of the semiconductor channel region (1), and forming a dielectric layer (3) at the bottom surface (2d) (e.g. by thermally oxidizing the bottom surface), thereby forming the first dielectric structure, the first dielectric structure having a maximal equivalent oxide thickness, measured perpendicularly to the first part, thereby forming a gate dielectric suitable for being exposed to a fluid to be sensed, wherein the dielectric layer (4a) present on the sidewalls (2s) and the top surface (2u), and the dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

To obtain the embodiment of FIG. 10, before oxidizing the bottom surface (2d) of the channel (1), the channel (1) can be recessed to create a situation similar to FIG. 2.

The temporary carrier may then be removed.

The device depicted in FIG. 10 is an example of a sensor that can be obtained by a method comprising the steps of:

providing a semiconductor-on-insulator substrate comprising a semiconductor layer on a layer of an oxide of that semiconductor layer (e.g. a $SiO_2$ layer, also called buried oxide, in the case of a Si substrate), patterning the semiconductor layer to form an active region, the active region comprising a drain region, a source region, and a semiconductor channel region (1) between the drain region and the source region, the channel region having a length, a periphery and a height, the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, forming a dielectric layer (4a) around the exposed part of the periphery (2) (e.g. by thermally oxidizing the exposed part of the periphery), overlying the active region and the substrate with a dielectric coating at least as thick as the height (Hc) of the channel region (1), removing a top portion of the dielectric coating without exposing the dielectric layer, removing the layer of the oxide of the semiconductor layer, thereby exposing the bottom surface of the semiconductor channel region, removing a (top) portion of the bottom surface so as to form a cavity, forming a dielectric layer at the bottom surface (e.g. by thermally oxidizing the bottom surface), thereby forming the first dielectric structure, the first dielectric structure having a maximal equivalent oxide thickness, measured perpendicularly to the first part, thereby forming a gate dielectric suitable for being exposed to a fluid to be sensed, wherein the dielectric layer (4a) present on the sidewalls (2s) and the top surface (2u), and the dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

Figure 3:
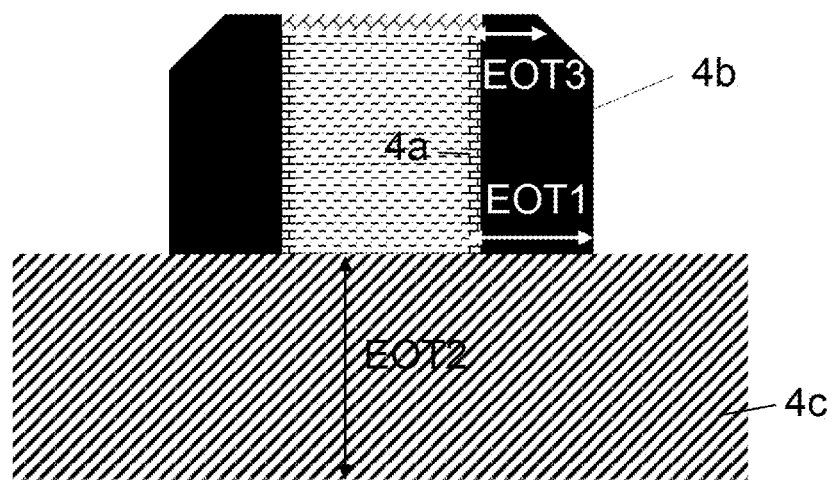
Figure 4:
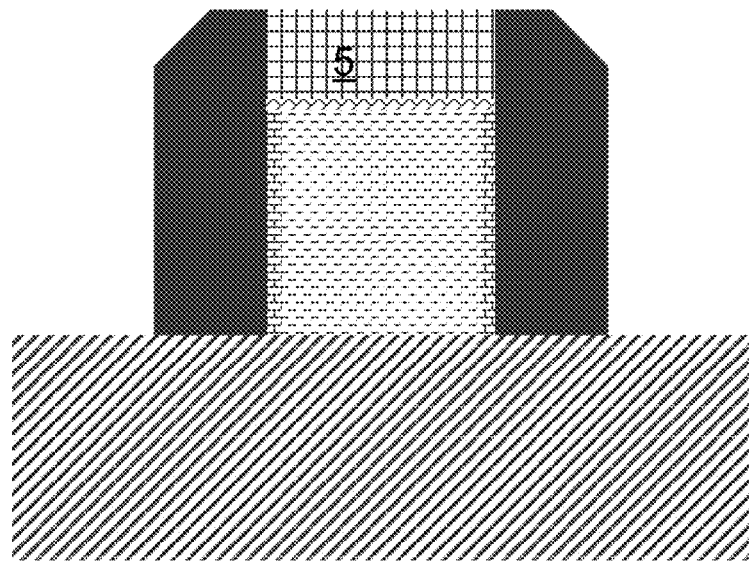

The device depicted in FIG. 3 is a representative example of a sensor that can be obtained by a method comprising the steps of:

providing a semiconductor-on-insulator substrate comprising a semiconductor layer on a layer made of an oxide of that semiconductor (e.g. a $SiO_2$ layer, also called buried oxide, in the case of a Si substrate), patterning the semiconductor layer to form an active region, the active region comprising a drain region, a source region, and a semiconductor channel region (1) between the drain region and the source region, the channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, the periphery (2) comprising sidewall surfaces (2d), forming a dielectric layer (3, 4a) around the exposed part of the periphery (2) (e.g. by thermally oxidizing the periphery), forming dielectric spacers (4b) on the sidewall surfaces of the active region, replacing the dielectric layer exposed on the top surface of the periphery by:
removing the dielectric layer, thereby exposing the top surface of the semiconductor channel region,
optionally removing a top portion of the semiconductor channel region, thereby exposing a fresh surface of the semiconductor channel, and
forming a first dielectric structure (3) at the fresh surface (e.g. by thermal oxidation), the first dielectric structure having a maximal equivalent oxide thickness, measured perpendicularly to the first part, thereby forming a gate dielectric suitable for being exposed to a fluid to be sensed,
wherein the dielectric substrate (4c), the dielectric layer (4a) present on the sidewalls (2s), and the dielectric spacers (4b) together form the second dielectric structure (4) present on the entire second part (2b), the second dielectric structure (4) having a minimal equivalent oxide thickness, measured perpendicularly to the second part, larger than the maximal equivalent oxide thickness of the first dielectric structure, thereby forming an isolation structure.

In FIG. 3, it can be seen that the EOT of the second dielectric structure takes different values (EOT 1, 2, and 3) when measured perpendicularly to different locations on the second part. Assuming that 4a, 4b, and 4c are all made of the same material, EOT3 would be the MinEOT of the second dielectric structure (4) since it is the smallest EOT that can possibly be measured perpendicularly to the second part.

The device depicted in FIG. 4 is a representative example of a sensor that can be obtained by a method comprising the steps of:
providing a semiconductor-on-insulator substrate comprising a semiconductor layer on a layer made of an oxide of that semiconductor (e.g. a $SiO_2$ layer, also called buried oxide, in the case of a Si substrate),
providing a patterned hardmask layer (5) on the semiconductor layer,
patterning the semiconductor layer with the patterned hardmask (5) to form an active region, the active region comprising a drain region, a source region, and a semiconductor channel region (1) between the drain region and the source region, the channel region (1) having a length, a periphery (2) and a height (Hc), the periphery (2), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, the periphery comprising sidewall surfaces (2s),
forming a dielectric layer (4a) around the part of the periphery (2) not covered by the hardmask (5) (e.g. by thermally oxidizing the periphery),
forming dielectric spacers (4b) on the sidewall surfaces of the active region and of the hardmask (5),
removing the hardmask (4), thereby exposing a top surface (2u) of the channel region (1)
forming a first dielectric structure at the top surface (2u) (e.g. by thermal oxidation), the first dielectric structure having a maximal equivalent oxide thickness, measured perpendicularly to the first part, thereby forming a gate dielectric suitable for being exposed to a fluid to be sensed, wherein the dielectric substrate (4c), the dielectric layer (4a) present on the sidewalls (2s), and the dielectric spacers (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

The device depicted in FIG. 5 is a representative example of a sensor that can be obtained by a method comprising the steps of:
providing a semiconductor-on-insulator substrate comprising a semiconductor layer on a layer made of an oxide of that semiconductor (e.g. a $SiO_2$ layer, also called buried oxide, in the case of a Si substrate),
overlaying the semiconductor layer with a dielectric coating,
patterning both the semiconductor layer and the dielectric coating to form an active region, the active region comprising a drain region, a source region, and a semiconductor channel region (1) between the drain region and the source region, the channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, the periphery (2) comprising sidewall surfaces (2s), and
forming a dielectric layer (3) around the exposed part of the periphery (e.g. by thermally oxidizing the periphery), the dielectric layer (3) forming a first dielectric structure (3) having a maximal equivalent oxide thickness, measured perpendicularly to the first part, thereby forming a gate dielectric suitable for being exposed to a fluid to be sensed,
wherein the dielectric substrate (4c), the dielectric layer (4a) present on the top surface (4u), and the patterned dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

The device depicted in FIG. 6 is a representative example of a sensor that can be obtained by a method comprising the steps of:
providing a semiconductor-on-insulator substrate comprising a semiconductor layer on a layer (4c) made of an oxide of that semiconductor (e.g. a $SiO_2$ layer, also called buried oxide, in the case of a Si substrate),
overlaying the semiconductor with a dielectric layer,
patterning both the semiconductor layer and the dielectric layer to form an active region, and part (4b) of a second dielectric structure (4), the active region comprising a drain region, a source region, and a semiconductor channel region (1) between the drain region and the source region, the channel region (1) having a length, a periphery (2) and a height (Hc), the periphery consisting of one or more surfaces having said length, said periphery consisting of a first part and a second part, the second part being different from the first part, each part having said length, the first part representing from 10 to 75% of the area of the periphery and the second part representing from 25 to 90% of the area of the periphery, the periphery (2) comprising sidewall surfaces (2s), trimming the active region (e.g. by one or more cycles consisting of thermally oxidizing the active region surface followed by removing the formed thermal oxide), forming a dielectric layer around the exposed part of the periphery (e.g. by thermally oxidizing the periphery), the dielectric layer (3) forming a first dielectric structure (3) having a maximal equivalent oxide thickness, measured perpendicularly to the first part, thereby forming a gate dielectric suitable for being exposed to a fluid to be sensed, wherein the dielectric substrate (4c), the dielectric layer (4a) present on the top surface (4u), and the patterned dielectric coating (4b) together form the second dielectric structure (4) present on the entire second part (2b), the second dielectric structure having a minimal equivalent oxide thickness, measured perpendicularly to the second part, larger than the maximal equivalent oxide thickness of the first dielectric structure, thereby forming an isolation structure.

It is to be understood that although various embodiments, specific constructions, and configurations, as well as materials, have been discussed herein for devices according to the present disclosure, various changes or modifications in form and detail may be made without departing from the scope of this disclosure. Steps may be added or deleted to methods described within the scope of the present disclosure.

What is claimed:

1. A method for forming a sensor, the method comprising:
providing an active region comprising a source region, a drain region, and a semiconductor channel region between the source region and the drain region, the semiconductor channel region having:
a length, and
a periphery consisting of one or more surfaces having said length, said periphery comprising a first part and a second part, the second part being different from the first part, each part having said length, the first part representing from 10 to 75% of an area of the periphery and the second part representing from 25 to 90% of the area of the periphery;
providing a first dielectric structure on the first part of the periphery, the first dielectric structure having a maximal equivalent oxide thickness, measured perpendicularly to the first part, thereby forming a gate dielectric suitable for being exposed to a fluid to be sensed; and
providing a second dielectric structure on the second part of the periphery, the second dielectric structure having a minimal equivalent oxide thickness, measured perpendicularly to the second part of the periphery, that is larger than the maximal equivalent oxide thickness of the first dielectric structure, thereby forming an isolation structure.

2. The method according to claim 1, further comprising:
providing a cavity having an interior, wherein the cavity is suitable for containing the fluid, and wherein the gate dielectric is exposed to said interior; and
providing a reference electrode, spatially separated from the gate dielectric, and exposed to said interior.

3. The method according to claim 1, wherein the first part of the periphery represents from 10 to 45% of the area of the periphery, and wherein the second part of the periphery represents from 55 to 90% of the area of the periphery.

4. The method according to claim 1, wherein the active region is comprised in a fin or a nanowire.

5. The method according to claim 1, wherein the periphery comprises a top surface, a bottom surface, and sidewall surfaces, wherein the first part of the periphery is the top surface and wherein the second part of the periphery comprise the sidewall surfaces.

6. The method according to claim 5, wherein the second part of the periphery consists of the sidewall surfaces.

7. The method according to claim 5, wherein the second part of the periphery consists of the sidewall surfaces and the bottom surface.

8. The method according to claim 5, wherein the sidewall surfaces have a width, wherein the second dielectric structure covers the width (Ws), and wherein a part of the second dielectric structure extends farther than the width (Ws) so as to form a cavity delimited by a top surface of the first dielectric structure and the part of the second dielectric structure extending farther than the width (Ws).

9. The method according to claim 8, wherein the second part of the periphery consists of the sidewall surfaces.

10. The method according to claim 8, wherein the second part of the periphery consists of the sidewall surfaces and the bottom surface.

11. The method according to claim 1, wherein the periphery comprises a top surface, a bottom surface and sidewall surfaces, wherein the first part of the periphery is the sidewall surfaces and wherein the second part of the periphery is the top surface and the bottom surface.

12. The method according to claim 11, wherein the top surface has a width (Wu) and wherein the second dielectric structure is present over the width (Wu) of the top surface and extends farther than the width (Wu).

13. The method according to claim 4, wherein the active region is comprised in a nanowire, wherein the periphery comprises a top surface, a bottom surface, and sidewall surfaces, and wherein the first part is the bottom surface and the second part is the top surface and the sidewall surfaces.

14. The method according to claim 1, wherein the maximal equivalent oxide thickness of the first dielectric structure ranges from 0.5 nm to 4 nm.

15. The method according to claim 1, wherein the minimal equivalent oxide thickness of the second dielectric structure is larger than 10 nm.

16. The method according to claim 1, wherein the semiconductor channel region has a width (Wc) and a height (Hc) which are both smaller than 10 nm.

17. The method according to claim 1, wherein the semiconductor channel region has a width (Wc) and a height (Hc) which are both smaller than than 6 nm.

18. The method according to claim 1, wherein the first part of the periphery comprises a semiconductor channel surface with Miller indices {001}.

19. The method according to claim 1, wherein the first part of the periphery and the second part of the periphery add up to at least 60%, at least 70%, at least 80%, at least 90%, or at least 95% of the area of the periphery.

20. The method according to claim 19, wherein the first part of the periphery and the second part of the periphery add up to 100% of the area of the periphery.

* * * * *